(12) United States Patent
Verbist et al.

(10) Patent No.: US 7,135,930 B2
(45) Date of Patent: *Nov. 14, 2006

(54) SWITCHED SUPPLY FOR OPERATIONAL AMPLIFIER

(75) Inventors: Rudi Verbist, Schriek (BE); Raphael Cassiers, Braine-l'Alleud (BE)

(73) Assignee: Broadcom Corporation, Irvine, CA (US)

( * ) Notice: Subject to any disclaimer, the term of this patent is extended or adjusted under 35 U.S.C. 154(b) by 325 days.

This patent is subject to a terminal disclaimer.

(21) Appl. No.: 10/647,477

(22) Filed: Aug. 26, 2003

(65) Prior Publication Data

US 2004/0051389 A1 Mar. 18, 2004

Related U.S. Application Data

(60) Continuation of application No. 10/096,984, filed on Mar. 12, 2002, now Pat. No. 6,621,350, which is a division of application No. 09/692,656, filed on Oct. 19, 2000, now Pat. No. 6,400,228.

(30) Foreign Application Priority Data

Aug. 31, 2000 (GB) ................... 0021438.7

(51) Int. Cl.
*H03F 3/04* (2006.01)

(52) U.S. Cl. ..................................... 330/297; 330/127
(58) Field of Classification Search ................ 330/297, 330/127, 129, 136
See application file for complete search history.

(56) References Cited

U.S. PATENT DOCUMENTS

| | | | | |
|---|---|---|---|---|
| 4,873,493 | A | * | 10/1989 | Fujiwara ..................... 330/285 |
| 5,546,051 | A | * | 8/1996 | Koizumi et al. ............ 330/297 |
| 5,760,652 | A | | 6/1998 | Maemura et al. |
| 5,898,342 | A | | 4/1999 | Bell |
| 5,990,751 | A | | 11/1999 | Takita |
| 6,218,897 | B1 | * | 4/2001 | Barzegar et al. .............. 330/51 |
| 6,400,228 | B1 | | 6/2002 | Verbist et al. |
| 6,621,350 | B1 | | 9/2003 | Verbist et al. |

* cited by examiner

*Primary Examiner*—Henry Choe
(74) *Attorney, Agent, or Firm*—Sterne, Kessler, Goldstein & Fox P.L.L.C.

(57) ABSTRACT

There is provided a circuit and method for providing a supply voltage to an operational amplifier. A switch has a plurality of inputs connected to a respective plurality of supply voltages. An output of the switch is connected to a supply voltage terminal of an operational amplifier. The input of the switch is selected in dependence of the voltage levels to which a signal is to be amplified

20 Claims, 1 Drawing Sheet

SWITCHED SUPPLY FOR OPERATIONAL AMPLIFIER

CROSS-REFERENCE TO RELATED APPLICATIONS

This application is a continuation of application Ser. No. 10/096,984, filed Mar. 12, 2002, now U.S. Pat. No. 6,621,350, which is a divisional of application Ser. No. 09/692,656, filed Oct. 19, 2000, now U.S. Pat. No. 6,400,228, which claims priority to Great Britain application no. 0021438.7, filed Aug. 31, 2000, now United Kingdom Patent No. 2,366,461.

FIELD OF THE INVENTION

The present invention relates to a technique for providing supply voltages to a supply terminal of an operational amplifier.

BACKGROUND TO THE INVENTION

In certain applications the voltage levels to which an operational amplifier is required to drive signals is variable. Thus, for example, the operational amplifier may at times be required to drive output signals to a voltage level of 15 volts, whilst at other times it may only be necessary to drive output signals to a voltage level of 5 volts. However in order to cover the full range of possible output voltage levels, the operational amplifier is required to be provided with the voltage supply corresponding to the highest voltage level, namely in this example 15 volts.

It is therefore an object of the present invention to provide an improved technique for providing a supply voltage to a supply terminal of an operational amplifier.

SUMMARY OF THE INVENTION

In accordance with a first aspect of the present invention there is provided a circuitry for providing a supply voltage to an operational amplifier, comprising:
  a switch having a plurality of inputs connected to a respective plurality of supply voltages, and an output connected to a supply voltage terminal of the operational amplifier, wherein the input of the switch is selected in dependence on the voltage level to which a signal is to be amplified. Thus, advantageously the operational amplifier is only provided with a supply voltage level corresponding to the highest voltage level to which it requires to drive a signal, thereby saving power consumption when only low voltage levels are needed.

A digital to analogue converter may receive digitised values, and generate a corresponding analogue signal for amplification by the operational amplifier. The input of the switch may be selected in dependence on the digitised values. The input of the switch may be selected in dependence on either the peak digitised value of the digitised values or the average digitised value of the digitised values.

The input of the switch may be selected by a control signal generated in dependence on the digitised values. The digitised values may be stored in the digital to analogue converter.

Preferably the switch has a first and a second input connected to a respective first and second supply voltages, a first supply voltage being lower than the second supply voltage, wherein the input of the switch is selected to be the second input if the voltage level to which the signal is to be amplified exceeds a predetermined level.

The circuitry for providing the supply voltage to the operational amplifier may further comprise:
  a further switch having a plurality of inputs connected to a respective plurality of further supply voltages, and an output connected to a further supply voltage terminal of the operational amplifier, wherein the input of the further switch is selected in dependence on the voltage level to which the signal is to amplified.

In a further aspect the present invention provides a method of providing a supply voltage to an operational amplifier, comprising the steps of:
  providing a plurality of supply voltages; selecting one of the supply voltages in dependence on the voltage level to which a signal is to be amplified; and connecting the selected one of the plurality of supply voltages to a supply voltage terminal of the operational amplifier.

The method may further comprise the step of converting digitised values into an analogue signal for amplification by the operational amplifier. The step of selecting one of the supply voltages may be dependent upon the digitised values. The step of selecting one of the supply voltages may be dependent upon either the peak digitised value of the digitised values, or the average digitised value of the digitised values.

The step of selecting one of the supply voltages may include generating a control signal in dependence of the digitised values.

Preferably there is provided a first and second supply voltage, the first supply voltage being lower that the second supply voltage, wherein the second supply voltage is selected if the voltage level to which the signal is to amplified exceeds a predetermined level.

The method of providing the supply voltage to the operational amplifier may further comprise the steps of:
  providing a plurality of further supply voltages; selecting one of the further supply voltages in dependence on the voltage level to which a signal is to be amplified; and connecting the selected one of the plurality of further supply voltages to a further supply voltage terminal of the operational amplifier.

The circuitry for providing the supply voltage to the operational amplifier, or the method for providing a supply voltage to the operational amplifier, may be associated with an xDSL modem. A DSL is a digital subscriber line. The term "x" in front of DSL implies that the invention is relevant to any type of digital subscriber line technology. For example, the invention is relevant to ADSL (asymmetric digital subscriber line) technology, the VDSL (very-high-data-rate digital subscriber line) technology, HDSL (high bit rate digital subscriber line) technology etc.

BRIEF DESCRIPTION OF THE DRAWINGS

The invention will now be described with regard to a non-limiting example by way of reference to the accompanying drawings in which.

DESCRIPTION OF THE PREFERRED EMBODIMENTS

The following example of the present invention is described with specific reference to an application in an ADSL (asymmetric digital subscriber line) implementation. It will be apparent to the person skilled in the art that the present invention is generally applicable to any operational amplifier implementation.

Figure 1:
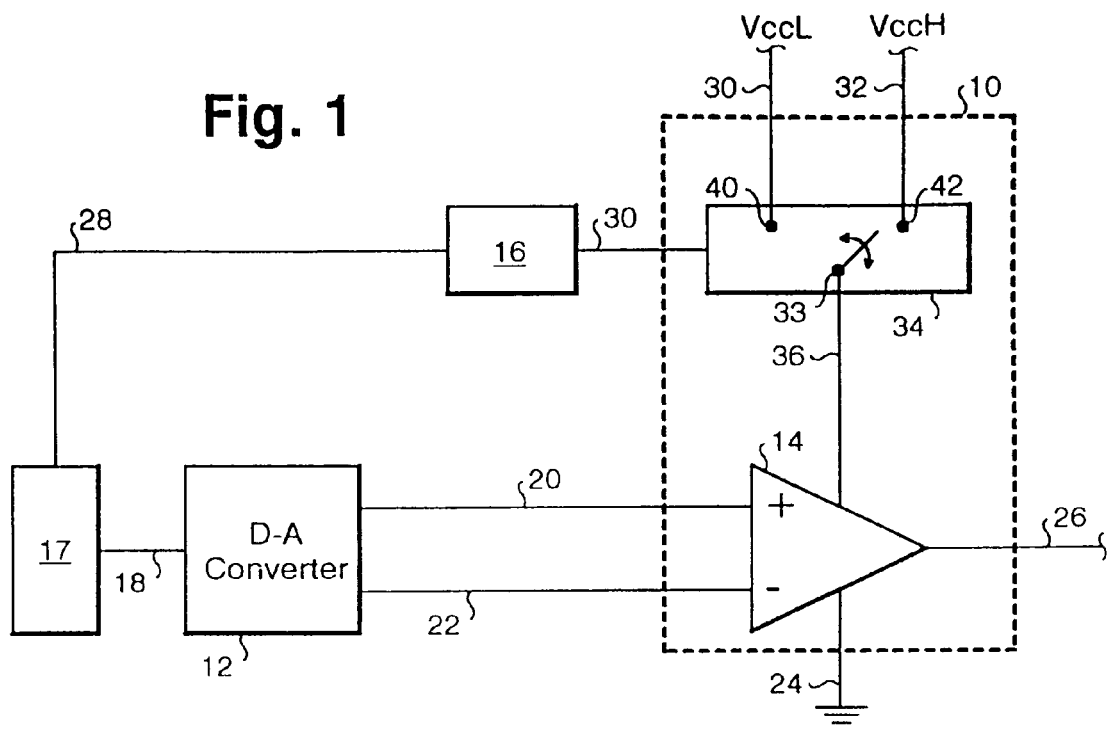
FIG. 1 illustrates a first embodiment of a circuitry for providing a supply voltage to an operational amplifier in accordance with the present invention.

Referring to FIG. 1, the operational amplifier block according to the present invention as shown in this embodiment is generally designated by reference numeral 10. The block comprises an operational amplifier 14 and a switch 34. For the purposes of describing the present invention in this example there is also provided a digital to analogue converter 12 and a logic gate 16. The digital to analogue converter 12 receives digital values on line 18, and generates an analogue signal on lines 20 and 22 to the positive and negative inputs of the operational amplifier 14 as is well known in the art. The operational amplifier 14 has a first supply voltage terminal 36 connected to a node 33 of the switch 34. A second supply voltage terminal 24 of the operational amplifier 14 is connected to ground. The operational amplifier 14 generates amplified analogue signals on line 26. A switch 34 has two additional nodes 40 and 42. Node 40 is connected to a supply voltage $V_{CCL}$ on line 30. Node 42 is connected to a supply voltage $V_{CCH}$ which is connected to line 32. An output of a digital to analogue converter 12 on line 28 is provided to logic gate 16 which in turn provides a control signal on line 30 to the switch 34.

As can be illustrated by the arrows within the switch unit 34, the switch 34 is controllable to connect node 33 to either the node 40 or 42. In this way the first supply terminal 36 of the operational amplifier receives either the supply voltage $V_{CCL}$ on line 30 or the supply voltage of $V_{CCH}$ on line 32.

The digitised values provided on line 18 to the digital to analogue converter 12 are indicative of the voltage levels to which the analogue signal on the output on line 26 of the operational amplifier are to be driven to. Thus, these values are indicative of the supply voltage level, either $V_{CCL}$ or $V_{CCH}$, which the first supply terminal 36 of the operational amplifier should be connected to. Thus the logic gate 16 will generate a signal on its output 30 in dependence on the value of line 18 provided to the digital to analogue converter 12 meeting certain predetermined conditions. Thus the logic gate 16 may be configured to detect a digitised value above a certain threshold value, and responsive thereto may set the signal on line 30 to switch to the higher supply voltage $V_{CCH}$.

Alternatively, rather than the logic gate 16 being configured to switch to a high supply voltage responsive to a single peak being detected above a threshold level, the logic gate 16 may be adapted to accumulate the digitised values and determine the average value thereof, and only response to the average value being above a peak is the control signal 30 set to switch to the higher supply voltage $V_{CCH}$.

Figure 2:
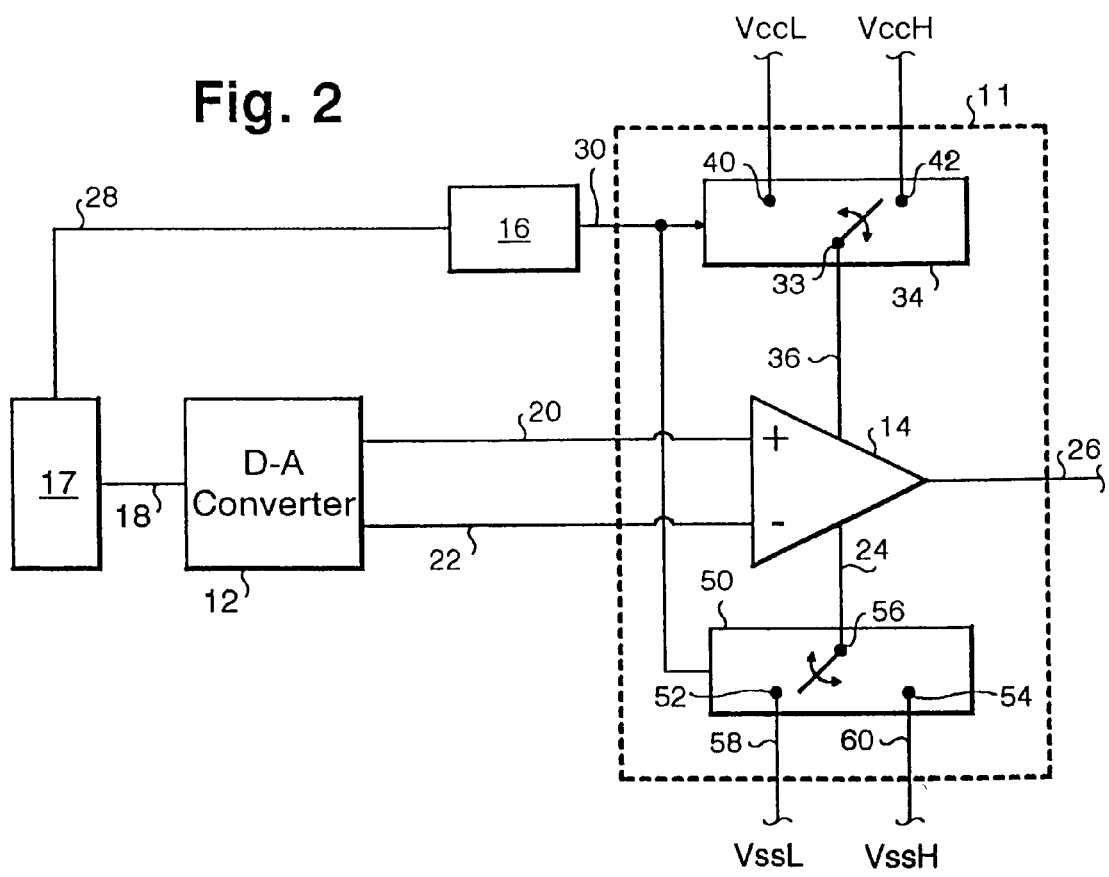
FIG. 2 illustrates a second embodiment of circuitry for providing a supply voltage to an operation amplifier in accordance with the present invention.

Referring to FIG. 2, there is illustrated a second exemplary embodiment for controlling an operational amplifier according to the present invention. Like reference numerals are used to denote elements corresponding to elements shown in FIG. 1.

Thus, as can be seen from FIG. 2, the operational amplifier block, designated by reference numeral 11, is modified to include a further switch 50 for controlling a supply voltage provided to the second supply voltage terminal 24 of the operational amplifier 14. The second supply voltage terminal 24 of the operational amplifier 14 is connected to a node 56 of the switch 50. The switch 50 additionally comprises two nodes 52 and 54. The node 52 is connected to the supply voltage level $V_{SSL}$ on line 58, and node 54 is connected to a supply voltage level $V_{SSH}$ on line 60. In addition the switch 50 receives the control signal on line 30 from the logic gate 16.

The operation of the general circuit of FIG. 2 is exactly the same as FIG. 1, with the exception that the control signal 30 now additionally controls the supply voltage applied to the second supply voltage terminal 24 of the operational amplifier. Thus, by way of example, the voltage level of $V_{CCL}$ may correspond to plus five volts, and the voltage level of $V_{SSL}$ correspond to minus five volts. In normal operation, the switches 34 and 50 may have a default setting in which the supply voltage terminal 36 is connected to the voltage $V_{CCL}$, and the supply voltage terminal 24 is connected to the voltage $V_{SSL}$. In this example, it may be considered that the voltage level $V_{CCH}$ is plus fifteen volts and the voltage level $V_{SSH}$ is minus fifteen volts. Responsive to the appropriate peak or average levels being detected in the digitised signals by the logic gate 16, the line 30 is set such that the switch 34 switches to connect the voltage $V_{CCH}$ the supply voltage terminal 36, and the switch 50 switches to connect the supply voltage terminal 24 to the supply voltage level $V_{SSH}$.

Thus it can be seen that with the use of the present invention power can be conserved by only applying the high voltage levels to the operational amplifier when it is required to amplify a signal to a higher voltage level.

What is claimed is:

1. Circuitry for providing a supply voltage to an operational amplifier, comprising:
    a switch having a plurality of inputs connected to a respective plurality of supply voltages, and an output connected to a supply voltage terminal of the operational amplifier; and
    a digital to analogue converter for receiving digitised values and for generating a corresponding analogue signal for amplification by the operational amplifier;
    wherein an input of the switch is selected in dependence on an average digitised value of the corresponding analogue signal and a voltage level to which the corresponding analogue signal is to be amplified.

2. Circuitry according to claim 1, wherein the input of the switch is selected by a control signal generated in dependence on the digitised values.

3. Circuitry according to claim 1, wherein the digitised values are stored in the digital to analogue converter.

4. Circuitry according to claim 1, wherein the switch has a first input and a second input connected respectively to a first supply voltage and a second supply voltage, the first supply voltage being lower than the second supply voltage, wherein the input of the switch is selected to be the second input if the voltage level to which the signal is to be amplified exceeds a predetermined level.

5. Circuitry according to claim 1, further comprising:
    a second switch having a plurality of inputs connected to a respective plurality of second supply voltages, and an output connected to a second supply voltage terminal of the operational amplifier, wherein an input of the second switch is selected in dependence on the voltage level to which the signal is to be amplified.

6. An xDSL modem including circuitry according to claim 1.

7. A method of providing a supply voltage to an operational amplifier, comprising the steps of:
provorsing a plurality of supply voltages;
converting digitised values into an analogue signal for amplification by the operational amplifier;
selecting one of the plurality of supply voltages in dependence on an average digitised value of the analogue signal and a voltage level to which the analogue signal is to be amplified; and
connecting the selected one of the plurality of supply voltages to a supply voltage terminal of the operational amplifier.

8. The method of claim 7, wherein the step of selecting includes generating a control signal in dependence on the digitised values.

9. The method according to claim 7 in which there is provided a first supply voltage and a second supply voltage, the first supply voltage being lower than the second supply voltage, wherein the second supply voltage is selected if the voltage level to which the signal is to be amplified exceeds a predetermined level.

10. A method of providing a supply voltage to an operational amplifier according to claim 7, further comprising the steps of:
providing a plurality of second supply voltages;
selecting one of the plurality of second supply voltages in dependence on the voltage level to which the signal is to be amplified; and
connecting the selected one of the plurality of second supply voltages to a second supply voltage terminal of the operational amplifier.

11. A method of providing a supply voltage to an operational amplifier of an xDSL modem according to claim 7.

12. A method of providing a supply voltage to an operational amplifier, comprising the steps of:
providing a first supply voltage and a second supply voltage;
determining an average value of an input signal to the operational amplifier; and
connecting one of the first supply voltage and the second supply voltage to a first power supply terminal of the operational amplifier in response to the average value.

13. The method of claim 12, further comprising the step of:
converting the input signal from a digital form to an analogue form.

14. The method of claim 13, wherein the analogue form of the input signal is a differential form.

15. The method of claim 12, further comprising the step of:
producing a control signal from the input signal.

16. The method of claim 15, wherein the control signal determines which one of the first supply voltage and the second supply voltage is to be connected to the first power supply terminal.

17. The method of claim 12, further comprising the steps of:
providing a third supply voltage and a fourth supply voltage; and
connecting one of the third supply voltage and the fourth supply voltage to a second power supply terminal of the operational amplifier in response to the average value.

18. The method of claim 17, further comprising the step of:
converting the input signal from a digital form to an analogue form.

19. The method of claim 18, further comprising the step of:
producing a control signal from the input signal.

20. The method of claim 19, wherein the control signal determines which one of the third supply voltage and the fourth supply voltage is to be connected to the second power supply terminal.

* * * * *